United States Patent
Becker et al.

(10) Patent No.: US 7,517,808 B2
(45) Date of Patent: *Apr. 14, 2009

(54) METHOD FOR FORMING AND REMOVING A PATTERNED SILICONE FILM

(75) Inventors: Gregory Becker, Sanford, MI (US); Geoffrey Gardner, Sanford, MI (US); Brian Harkness, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 367 days.

This patent is subject to a terminal disclaimer.

(21) Appl. No.: 10/565,036

(22) PCT Filed: Jul. 28, 2003

(86) PCT No.: PCT/US03/23601

§ 371 (c)(1), (2), (4) Date: Jan. 18, 2006

(87) PCT Pub. No.: WO2005/017627

PCT Pub. Date: Feb. 24, 2005

(65) Prior Publication Data

US 2006/0286809 A1  Dec. 21, 2006

Related U.S. Application Data

(63) Continuation-in-part of application No. 09/789,083, filed on Feb. 20, 2001, now Pat. No. 6,617,674.

(51) Int. Cl.
*H01L 21/469* (2006.01)
*H01B 13/00* (2006.01)
*C03C 15/00* (2006.01)

(52) U.S. Cl. ............................ 438/745; 216/21; 216/41; 438/781

(58) Field of Classification Search ................ 438/689, 438/745, 781; 257/678
See application file for complete search history.

(56) References Cited

U.S. PATENT DOCUMENTS

| | | | |
|---|---|---|---|
| 2,676,182 A | | 4/1954 | Daudt et al. |
| 3,889,023 A | * | 6/1975 | Plueddemann ............... 428/429 |
| 4,405,707 A | * | 9/1983 | Bierhenke et al. ......... 430/281.1 |
| 4,411,735 A | * | 10/1983 | Belani ......................... 438/701 |
| 4,510,094 A | | 4/1985 | Drahnak |
| 4,530,879 A | | 7/1985 | Drahnak |
| 4,584,355 A | | 4/1986 | Blizzard et al. |
| 4,585,836 A | | 4/1986 | Homan et al. |
| 4,591,622 A | | 5/1986 | Blizzard et al. |
| 5,389,170 A | * | 2/1995 | Brady et al. ................. 156/109 |
| 5,496,961 A | | 3/1996 | Dauth et al. |
| 5,854,302 A | * | 12/1998 | Foster et al. ................ 522/172 |
| 6,362,116 B1 | * | 3/2002 | Lansford ..................... 438/781 |
| 6,428,718 B1 | * | 8/2002 | Birdsley et al. ............... 216/84 |
| 6,503,847 B2 | * | 1/2003 | Chen et al. .................. 438/780 |
| 6,617,674 B2 | * | 9/2003 | Becker et al. ............... 257/678 |
| 2002/0000239 A1 | * | 1/2002 | Sachdev et al. ................ 134/2 |
| 2002/0158317 A1 | * | 10/2002 | Becker et al. ............... 257/678 |
| 2004/0241927 A1 | * | 12/2004 | Kato et al. ................... 438/202 |

OTHER PUBLICATIONS

JP 2002-135352, May 10, 2002, Sony Corporation. Abstract only.

* cited by examiner

*Primary Examiner*—Ha Tran T Nguyen
*Assistant Examiner*—Karen M Kusumakar
(74) *Attorney, Agent, or Firm*—Catherine U. Brown

(57) ABSTRACT

A method for reworking semiconductor materials includes: (i) applying a silicone composition to a surface of a substrate to form a film, (ii) exposing a portion of the film to radiation to produce a partially exposed film having non-exposed regions covering a portion of the surface and exposed regions covering the remainder of the surface; (iii) heating the partially exposed film for an amount of time such that the exposed regions are substantially insoluble in a developing solvent and the non-exposed regions are soluble in the developing solvent; (iv) removing the non-exposed regions of the heated film with the developing solvent to form a patterned film; (v) heating the patterned film for an amount of time sufficient to form a cured silicone layer; and (vi) removing all or a portion of the cured silicone layer by exposure to an anhydrous etching solution including an organic solvent and a base.

24 Claims, No Drawings

METHOD FOR FORMING AND REMOVING A PATTERNED SILICONE FILM

CROSS REFERENCE TO RELATED APPLICATIONS

This application is a U.S. national stage filing under 35 U.S.C. §371 of PCT Application No. PCT/US03/23601 filed on 28 Jul. 2003, currently pending, which is a continuation in part claiming the benefit of U.S. patent application Ser. No. 09/789,083 filed 20 Feb. 2001 now U.S. Pat. No. 6,617,674 under 35 U.S.C. §120. PCT Application No. PCT/US03/23601 and U.S. Pat. No. 6,617,674 corresponding to U.S. patent application Ser. No. 09/789,083 filed 20 Feb. 2001 are hereby incorporated by reference.

BACKGROUND

Photolithography is a technique in which a substrate is covered with a film of a photopatternable composition, which is a radiation-sensitive material. The film is selectively exposed to radiation, i.e., some portions of the film are exposed to the radiation while other portions remain unexposed. Selectively exposing the film may be performed by placing a photomask between the radiation source and the film. The photomask may be a radiation-transparent material having radiation-opaque patterns formed thereon. In positive resist photolithography, the exposed portions of the film are removed and the unexposed portions are left on the substrate. In negative resist photolithography, the unexposed portions of the film are removed and the exposed portions are left on the substrate.

Negative resist photolithography may be used to prepare photopatterned silicones that hold great promise for functioning as stress buffer layers, redistribution layers, dielectrics and solder masks for electronics applications such as MEMS, bioelectronics, display and integrated circuit (IC) packaging applications. These patterned silicones may be prepared by processes such as photolithography. Unfortunately, to date patterned silicones suffer from the drawback of not having a technique for removing the patterned silicone film if an error has occurred in the film deposition and patterning process. The process of removing a patterned film is called "rework", and it allows the patterned film with the error to be removed from the substrate surface so that the substrate can be recycled rather than be discarded.

Furthermore, silicones have been excluded from other electronics applications where removal of the silicone is a necessary or desirable feature for device builds. A technique to remove the silicone after patterning is needed for entry into markets such as negative photoresists.

SUMMARY

This invention relates to a method for removing all or a portion of a cured silicone layer from a substrate. The method comprises:
(i) applying a photopatternable silicone composition to a surface of a substrate to form a film;
(ii) exposing a portion of the film to radiation to produce a partially exposed film having non-exposed regions covering a portion of the surface and exposed regions covering the remainder of the surface;
(iii) heating the partially exposed film for an amount of time such that the exposed regions are substantially insoluble in a developing solvent and the non-exposed regions are soluble in the developing solvent;
(iv) removing the non-exposed regions of the heated film with the developing solvent to form a patterned film; optionally (v) heating the patterned film; and
(vi) removing all or a portion of the product of step (iv) when step (v) is not present or removing all or a portion of the product of step (v) when step (v) is present.

DETAILED DESCRIPTION OF THE PREFERRED EMBODIMENTS

All amounts, ratios, and percentages are by weight unless otherwise indicated. The terms "siloxane" and "silicone" are used interchangeably herein.

Photopatternable Silicone Composition

Photopatternable silicone compositions useful in the method of this invention are known in the art. Examples of suitable photopatternable silicone compositions are described in U.S. patent application Ser. No. 09/789,083, filed on Feb. 20, 2001, and having Publication No. 2002/0158317, which is hereby incorporated by reference. An example of a suitable photopatternable silicone composition comprises (A) an organopolysiloxane containing an average of at least two silicon-bonded alkenyl groups per molecule, (B) an organosilicon compound containing an average of at least two silicon-bonded hydrogen atoms per molecule in a concentration sufficient to cure the composition, and (C) a catalytic amount of a photoactivated hydrosilylation catalyst.

Component (A) is at least one organopolysiloxane containing an average of at least two silicon-bonded alkenyl groups per molecule. The organopolysiloxane can have a linear, branched, or resinous structure. The organopolysiloxane can be a homopolymer or a copolymer. The alkenyl groups typically have from 2 to about 10 carbon atoms and are exemplified by, but not limited to, vinyl, allyl, butenyl, and hexenyl. The alkenyl groups in the organopolysiloxane may be located at terminal, pendant, or both terminal and pendant positions. The remaining silicon-bonded organic groups in the organopolysiloxane are independently selected from monovalent hydrocarbon and monovalent halogenated hydrocarbon groups free of aliphatic unsaturation. These monovalent groups typically have from 1 to about 20 carbon atoms, preferably have from 1 to 10 carbon atoms, and are exemplified by, but not limited to alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. Preferably, at least 50 percent, and more preferably at least 80%, of the organic groups free of aliphatic unsaturation in the organopolysiloxane are methyl.

The viscosity of the organopolysiloxane at 25° C., which varies with molecular weight and structure, is typically from 0.001 to 100,000 Pa·s, preferably from 0.01 to 10,000 Pa·s, and more preferably from 0.01 to 1,000 Pa·s.

Examples of organopolysiloxanes useful in the silicone composition include, but are not limited to, polydiorganosiloxanes having the following formulae: $ViMe_2SiO(Me_2SiO)_a SiMe_2Vi$, $ViMe_2SiO(Me_2SiO)_{0.25a}(MePhSiO)_{0.75a}SiMe_2Vi$, $ViMe_2SiO(Me_2SiO)_{0.95a}(Ph_2SiO)_{0.05a}SiMe_2Vi$, $ViMe_2SiO(Me_2SiO)_{0.98a}(MeViSiO)_{0.02a}SiMe_2Vi$, $Me_3SiO(Me_2SiO)_{0.95a}(MeViSiO)_{0.05a}SiMe_3$, and $PhMeViSiO(Me_2SiO)_a SiPhMeVi$, where Me, Vi, and Ph denote methyl, vinyl, and phenyl respectively and a has a value such that the viscosity of the polydiorganosiloxane is from 0.001 to 100,000 Pa·s.

Methods of preparing organopolysiloxanes suitable for use in the silicone composition, such as hydrolysis and condensation of the corresponding organohalosilanes or equilibration of cyclic polydiorganosiloxanes, are well known in the art.

Examples of organopolysiloxane resins include an MQ resin consisting essentially of $R^1_3SiO_{1/2}$ units and $SiO_{4/2}$ units, a TD resins consisting essentially of $R^1SiO_{3/2}$ units and $R^1_2SiO_{2/2}$ units, an MT resin consisting essentially of $R^1_3SiO_{1/2}$ units and $R^1SiO_{3/2}$ units, and an MTD resin consisting essentially of $R^1_3SiO_{1/2}$ units, $R^1SiO_{3/2}$ units, and $R^1_2SiO_{2/2}$ units, wherein each $R^1$ is independently selected from monovalent hydrocarbon and monovalent halogenated hydrocarbon groups. The monovalent groups represented by $R^1$ typically have from 1 to about 20 carbon atoms and preferably have from 1 to about 10 carbon atoms. Examples of monovalent groups include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. Preferably, at least one-third, and more preferably substantially all $R^1$ groups in the organopolysiloxane resin are methyl. A preferred organopolysiloxane resin consists essentially of $(CH_3)_3SiO_{1/2}$ siloxane units and $SiO_{4/2}$ wherein the mole ratio of $(CH_3)_3SiO_{1/2}$ units to $SiO_{4/2}$ units is from 0.6 to 1.9.

Preferably, the organopolysiloxane resin contains an average of about 3 to 30 mole percent of alkenyl groups. The mole percent of alkenyl groups in the resin is defined here as the ratio of the number of moles of alkenyl-containing siloxane units in the resin to the total number of moles of siloxane units in the resin, multiplied by 100.

The organopolysiloxane resin can be prepared by methods well-known in the art. Preferably, the resin is prepared by treating a resin copolymer produced by the silica hydrosol capping process of Daudt et al. with at least an alkenyl-containing endblocking reagent. The method of Daudt et al, is disclosed in U.S. Pat. No. 2,676,182, which is hereby incorporated by reference to teach how to make organopolysiloxane resins suitable for use in the present invention.

Briefly stated, the method of Daudt et al. involves reacting a silica hydrosol under acidic conditions with a hydrolyzable triorganosilane such as trimethylchlorosilane, a siloxane such as hexamethyldisiloxane, or combinations thereof, and recovering a copolymer having M and Q units. The resulting copolymers generally contain from about 2 to about 5 percent by weight of hydroxyl groups.

The organopolysiloxane resin, which typically contains less than 2 percent by weight of silicon-bonded hydroxyl groups, can be prepared by reacting the product of Daudt et al. with an alkenyl-containing endblocking agent or a combination of an alkenyl-containing endblocking agent and an endblocking agent free of aliphatic unsaturation in an amount sufficient to provide from 3 to 30 mole percent of alkenyl groups in the final product. Examples of endblocking agents include, but are not limited to, silazanes, siloxanes, and silanes. Suitable endblocking agents are known in the art and exemplified in U.S. Pat. No. 4,584,355 to Blizzard et al.; U.S. Pat. No. 4,591,622 to Blizzard et al.; and U.S. Pat. No. 4,585,836 to Homan et al.; which are hereby incorporated by reference. A single endblocking agent or a combination of such agents can be used to prepare the organopolysiloxane resin.

Component (A) can be a single organopolysiloxane or a combination comprising two or more organopolysiloxanes that differ in at least one of the following properties: structure, viscosity, average molecular weight, siloxane units, and sequence.

Component (B) is at least one organosilicon compound containing an average of at least two silicon-bonded hydrogen atoms per molecule. It is generally understood that crosslinking occurs when the sum of the average number of alkenyl groups per molecule in component (A) and the average number of silicon-bonded hydrogen atoms per molecule in component (B) is greater than four. The silicon-bonded hydrogen atoms in the organohydrogenpolysiloxane can be located at terminal, pendant, or at both terminal and pendant positions.

The organosilicon compound can be an organosilane or an organohydrogensiloxane. The organosilane can be a monosilane, disilane, trisilane, or polysilane. Similarly, the organohydrogensiloxane can be a disiloxane, trisiloxane, or polysiloxane. Preferably, the organosilicon compound is an organohydrogensiloxane and more preferably, the organosilicon compound is an organohydrogenpolysiloxane. The structure of the organosilicon compound can be linear, branched, cyclic, or resinous. Preferably, at least 50 percent of the organic groups in the organosilicon compound are methyl.

Examples of organosilanes include, but are not limited to, monosilanes such as diphenylsilane and 2-chloroethylsilane; disilanes such as 1,4-bis(dimethylsilyl)benzene, bis[(p-dimethylsilyl)phenyl]ether, and 1,4-dimethyldisilylethane; trisilanes such as 1,3,5-tris(dimethylsilyl)benzene and 1,3,5-trimethyl-1,3,5-trisilane; and polysilanes such as poly(methylsilylene)phenylene and poly(methylsilylene) methylene.

Examples of organohydrogensiloxanes include, but are not limited to, disiloxanes such as 1,1,3,3-tetramethyldisiloxane and 1,1,3,3-tetraphenyldisiloxane; trisiloxanes such as phenyltris(dimethylsiloxy)silane and 1,3,5-trimethylcyclotrisiloxane; and polysiloxanes such as a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin consisting essentially of $H(CH_3)_2SiO_{1/2}$ units, $(CH_3)_3SiO_{1/2}$ units, and $SiO_{4/2}$ units.

Component (B) can be a single organosilicon compound or a combination comprising two or more such compounds that differ in at least one of the following properties: structure, average molecular weight, viscosity, silane units, siloxane units, and sequence.

The concentration of component (B) in the silicone composition of the present invention is sufficient to cure (crosslink) the composition. The exact amount of component (B) depends on the desired extent of cure, which generally increases as the ratio of the number of moles of silicon-bonded hydrogen atoms in component (B) to the number of moles of alkenyl groups in component (A) increases. Typically, the concentration of component (B) is sufficient to provide from 0.5 to 3 silicon-bonded hydrogen atoms per alkenyl group in component (A). Preferably, the concentration of component (B) is sufficient to provide from 0.7 to 1.2 silicon-bonded hydrogen atoms per alkenyl group in component (A).

Methods of preparing organosilicon compounds containing silicon-bonded hydrogen atoms are well known in the art. For example, organopolysilanes can be prepared by reaction of chlorosilanes in a hydrocarbon solvent in the presence of sodium or lithium metal (Wurtz reaction). Organopolysiloxanes can be prepared by hydrolysis and condensation of organohalosilanes.

To ensure compatibility of components (A) and (B), the predominant organic group in each component is preferably the same. Preferably this group is methyl.

Component (C) is a photoactivated hydrosilylation catalyst. The photoactivated hydrosilylation catalyst can be any hydrosilylation catalyst capable of catalyzing the hydrosilylation of component (A) with component (B) upon exposure to radiation having a wavelength of 150 to 800 nm and subsequent heating. The platinum group metals include platinum, rhodium, ruthenium, palladium, osmium and iridium. Preferably, the platinum group metal is platinum, based on its high activity in hydrosilylation reactions. The suitability of particular photoactivated hydrosilylation catalyst for use in the silicone composition of the present invention can be readily determined by routine experimentation using the methods in the Examples section below.

Examples of photoactivated hydrosilylation catalysts include, but are not limited to, platinum(II) β-diketonate complexes such as platinum(II) bis(2,4-pentanedioate), platinum (II) bis(2,4-hexanedioate), platinum(II) bis(2,4-heptanedioate), platinum(II) bis(1-phenyl-1,3-butanedioate, platinum (II) bis(1,3-diphenyl-1,3-propanedioate), platinum(II) bis(1, 1,1,5,5,5-hexafluoro-2,4-pentanedioate); (η-cyclopentadienyl)trialkylplatinum complexes, such as (Cp)trimethylplatinum, (Cp)ethyldimethylplatinum, (Cp)triethylplatinum, (chloro-Cp)trimethylplatinum, and (trimethylsilyl-Cp)trimethylplatinum, where Cp represents cyclopentadienyl; triazene oxide-transition metal complexes, such as Pt[$C_6H_5$NNNOC$H_3$]$_4$, Pt[p-CN—$C_6H_4$NNNO$C_6H_{11}$]$_4$, Pt[p-$H_3$CO$C_6H_4$NNNO$C_6H_{11}$]$_4$, Pt[p-C$H_3$(C$H_2$)$_x$—$C_6H_4$NNNOC$H_3$]$_4$, 1,5-cyclooctadiene.Pt[p-CN—$C_6H_4$NNNO$C_6H_{11}$]$_2$, 1,5-cyclooctadiene.Pt[p-C$H_3$O—$C_6H_4$NNNOC$H_3$]$_2$, [($C_6H_5$)$_3$P]$_3$Rh[p-CN—$C_6H_4$NNNO$C_6H_{11}$], and Pd[p-C$H_3$(C$H_2$)$_x$—$C_6H_4$NNNOC$H_3$]$_2$, where x is 1, 3, 5, 11, or 17; (η-diolefin) (σ-aryl)platinum complexes, such as ($\eta^4$-1,5-cyclooctadienyl)diphenylplatinum, $\eta^4$-1,3,5,7-cyclooctatetraenyl)diphenylplatinum, ($\eta^4$-2,5-norboradienyl)diphenylplatinum, ($\eta^4$-1,5-cyclooctadienyl)bis-(4-dimethylaminophenyl)platinum, ($\eta^4$-1,5-cyclooctadienyl)bis-(4-acetylphenyl)platinum, and ($\eta^4$-1,5-cyclooctadienyl)bis-(4-trifluormethylphenyl)platinum. Preferably, the photoactivated hydrosilylation catalyst is a Pt(II) β-diketonate complex and more preferably the catalyst is platinum(II) bis(2,4-pentanedioate).

Component (C) can be a single photoactivated hydrosilylation catalyst or a combination comprising two or more such catalysts.

The concentration of component (C) is sufficient to catalyze the addition reaction of components (A) and (B) upon exposure to radiation and heat in the method described below. The concentration of component (C) is sufficient to provide typically from 0.1 to 1000 ppm of platinum group metal, preferably from 0.5 to 100 ppm of platinum group metal, and more preferably from 1 to 25 ppm of platinum group metal, based on the combined weight of components (A), (B), and (C). The rate of cure is very slow below 1 ppm of platinum group metal. The use of more than 100 ppm of platinum group metal results in no appreciable increase in cure rate, and is therefore uneconomical.

Methods of preparing the preceding photoactivated hydrosilylation catalysts are well known in the art. For example, methods of preparing platinum(II) β-diketonates are reported by Guo et al. (Chemistry of Materials, 1998, 10, 531-536). Methods of preparing (η-cyclopentadienyl)trialkylplatinum complexes and are disclosed in U.S. Pat. No. 4,510,094. Methods of preparing triazene oxide-transition metal complexes are disclosed in U.S. Pat. No. 5,496,961. And, methods of preparing (η-diolefin)(σ-aryl)platinum complexes are taught in U.S. Pat. No. 4,530,879.

Combinations of the aforementioned components (A), (B), and (C) may begin to cure at ambient temperature. To obtain a longer working time or "pot life", the activity of the catalyst under ambient conditions can be retarded or suppressed by the addition of a suitable inhibitor to the silicone composition of the present invention. A platinum catalyst inhibitor retards curing of the present silicone composition at ambient temperature, but does not prevent the composition from curing at elevated temperatures. Suitable platinum catalyst inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as the well known dialkyl, dialkenyl, and dialkoxyalkyl fumarates and maleates; and cyclovinylsiloxanes. Acetylenic alcohols constitute a preferred class of inhibitors in the silicone composition of the present invention.

The concentration of platinum catalyst inhibitor in the present silicone composition is sufficient to retard curing of the composition at ambient temperature without preventing or excessively prolonging cure at elevated temperatures. This concentration will vary widely depending on the particular inhibitor used, the nature and concentration of the hydrosilylation catalyst, and the nature of the organohydrogenpolysiloxane.

Inhibitor concentrations as low as one mole of inhibitor per mole of platinum group metal will in some instances yield a satisfactory storage stability and cure rate. In other instances, inhibitor concentrations of up to 500 or more moles of inhibitor per mole of platinum group metal may be required. The optimum concentration for a particular inhibitor in a given silicone composition can be readily determined by routine experimentation.

The silicone composition of the present invention can also comprise additional ingredients, provided the ingredient does not adversely affect the photopatterning or cure of the composition in the method of the present invention. Examples of additional ingredients include, but are not limited to, adhesion promoters, solvents, inorganic fillers, photosensitizers, and surfactants.

The silicone composition of the present invention can further comprise an appropriate quantity of at least one organic solvent to lower the viscosity of the composition and facilitate the preparation, handling, and application of the composition. Examples of suitable solvents include, but are not limited to, saturated hydrocarbons having from 1 to about 20 carbon atoms; aromatic hydrocarbons such as xylenes and mesitylene; mineral spirits; halohydrocarbons; esters; ketones; silicone fluids such as linear, branched, and cyclic polydimethylsiloxanes; and combinations of such solvents. The optimum concentration of a particular solvent in the present silicone composition can be readily determined by routine experimentation.

The silicone composition of the present invention can be a one-part composition comprising components (A) through (C) in a single part or, alternatively, a multi-part composition comprising components (A) through (C) in two or more parts. In a multi-part composition, components (A), (B), and (C) are typically not present in the same part unless an inhibitor is also present. For example, a multi-part silicone composition can comprise a first part containing a portion of component (A) and a portion of component (B) and a second part containing the remaining portion of component (A) and all of component (C).

The one-part silicone composition of the instant invention is typically prepared by combining components (A) through (C) and any optional ingredients in the stated proportions at ambient temperature with or without the aid of a solvent, which is described above. Although the order of addition of the various components is not critical if the silicone composition is to be used immediately, the hydrosilylation catalyst is preferably added last at a temperature below about 30° C. to prevent premature curing of the composition. Also, the multi-part silicone composition of the present invention can be prepared by combining the particular components designated for each part.

Method of this Invention

Steps (i)-(v) of the method described above may be carried out, for example, as described in U.S. patent application Ser. No. 09/789,083, filed on Feb. 20, 2001, and having Publication No. 2002/0158317, which is hereby incorporated by reference. In the method described above, the substrate may be an active surface of a semiconductor wafer, and the method may comprise:
(i) applying a photopatternable silicone composition to an active surface of a semiconductor wafer to form a film, wherein the active surface comprises a plurality of bond pads;
(ii) exposing a portion of the film to radiation to produce a partially exposed film having non-exposed regions covering at least a portion of each bond pad and exposed regions covering the remainder of the active surface;
(iii) heating the partially exposed film for an amount of time such that the exposed regions are substantially insoluble in a developing solvent and the non-exposed regions are soluble in the developing solvent;
(iv) removing the non-exposed regions of the heated film with the developing solvent to form a patterned film;
optionally (v) heating the patterned film; and
(vi) removing all or a portion of the product of step (iv) when step (v) is not present or removing all or a portion of the product of step (v) when step (v) is present.

Step (i)

The photopatternable silicone composition, described above, can be applied to the active surface of the semiconductor wafer using any conventional method, such as spin coating, dipping, spraying, or screen printing. Preferably, the photopatternable silicone composition is applied by spin coating at a speed of 500 to 6,000 rpm for 5 to 60 s. The volume of photopatternable silicone composition applied in the spin coating method is typically 0.1 to 5 mL. The spin speed, spin time, and volume of photopatternable silicone composition can be adjusted to produce a cured silicone layer (step v) having a thickness of 0.1 to 200 µm.

When the photopatternable silicone composition comprises a solvent, the method can further comprise removing at least a portion of the solvent from the film. Preferably, the solvent is removed by heating the film at a temperature of 50 to 150° C. for 1 to 5 minutes and more preferably the solvent is removed by heating the film at a temperature of 80 to 120° C. for 2 to 4 minutes.

Step (ii)

A portion of the resulting film is exposed to radiation to produce a partially exposed film having non-exposed regions covering at least a portion of each bond pad and exposed regions covering the remainder of the active surface of the wafer. When the wafer further comprises scribe lines, the photopatternable silicone composition overlying the lines is typically not exposed to radiation. The light source typically used is a medium pressure mercury-arc lamp. The wavelength of the radiation is typically 150 to 800 nm and preferably 250 to 450 nm. The dose of radiation is typically 0.1 to 5,000 mJ/cm$^2$ and preferably 250 to 1,300 mJ/cm$^2$. Selected regions of the film are exposed to the radiation through a photomask having a pattern of images.

Step (iii)

The partially exposed film is heated for an amount of time such that the regions that were exposed to radiation ("exposed regions") are substantially insoluble in a developing solvent. The regions that were not previously exposed to radiation ("non-exposed regions") are soluble in the developing solvent. The term "substantially insoluble" means that the exposed regions of the partially exposed film are not removed by dissolution in a developing solvent to the extent that the underlying active surface of the wafer is exposed. The term "soluble" means that the unexposed regions of the partially exposed film are removed by dissolution in a developing solvent, exposing the underlying active surface of the wafer. The partially exposed film is typically heated at a temperature of 50 to 250° C. for 0.1 to 10 minutes, preferably heated at a temperature of 100 to 200° C. for 1 to 5 minutes, and more preferably heated at a temperature of 135 to 165° C. for 2 to 4 minutes. The partially exposed film can be heated using conventional equipment such as a hot plate or oven.

Step (iv)

The non-exposed regions of the heated film are removed with a developing solvent to form a patterned film. The developing solvent is an organic solvent in which the non-exposed regions of the heated film are at least partially soluble and the exposed regions are essentially insoluble. The developing solvent typically has from 3 to 20 carbon atoms. Examples of developing solvents include ketones, such as methyl isobutyl ketone and methyl pentyl ketone; ethers, such as n-butyl ether and polyethylene glycol monomethylether; esters, such as ethyl acetate and γ-butyrolactone; aliphatic hydrocarbons, such as nonane, decalin, and dodecane; and aromatic hydrocarbons, such as mesitylene, xylene, and toluene. The developing solvent can be applied by any conventional method, including spraying, immersion, and pooling. Preferably, the developing solvent is applied by forming a pool of the solvent on a stationary wafer and then spin-drying the wafer. The developing solvent is typically used at a temperature of room temperature to 100° C. However, the specific temperature will depend on the chemical properties of the solvent, the boiling point of the solvent, the desired rate of pattern formation, and the requisite resolution of the photopatterning process.

Step (v)

The patterned film may then be heated for an amount of time sufficient to remove residual developing solvent, to form a cured silicone layer, or both. Step (v) is optional, and may not be needed in some applications, such as some photoresist applications. When step (v) is included in the method, the patterned film may be heated for an amount to achieve maximum crosslink density in the silicone without oxidation or decomposition. The patterned film is typically heated at a temperature of 50 to 300° C. for 1 to 300 minutes, preferably heated at a temperature of 75 to 275° C. for 10 to 120 minutes, and more preferably heated at a temperature of 200 to 250° C. for 20 to 60 minutes. The patterned film can be heated using conventional equipment such as a hot plate or oven.

Step (vi)

All or a portion of the silicone i.e., the patterned film formed in step (iv) or the cured silicone layer formed in step (v), may then be removed. The silicone may be removed by exposure to an etching solution comprising an organic solvent and a base. The organic solvent may be, for example, a monohydric alcohol such as methanol, ethanol, n-propanol, isopropanol, n-butanol, isobutanol, tert-butanol, and combinations thereof; a dihydric alcohol such as ethylene glycol and propylene glycol and combinations thereof; a monoether such as ethylene glycol ether and propylene glycol ether and combinations thereof; a diether such as ethylene diglycol ether, propylene diglycol ether, 1-methoxy-2-propanol, and combinations thereof; a polar aprotic solvent such as N-methyl pyrrolidone, tetrahydrofuran, dimethylsulfoxide, gamma-butyrolactone, and dimethylacetamide, and combinations thereof. The solvents may include water, but the amount of water is preferably less than or equal to 25% by weight of the composition, alternatively less than or equal to 6% by weight of the composition, alternatively less than or equal to 3% by weight of the composition, and alternatively anhydrous. Without wishing to be bound by theory it is thought that water slows the time for removal of the silicone, and may prevent removal of the silicone in some applications, therefore, an anhydrous etching solution is preferred.

The base may be an inorganic base such as ammonium hydroxide, cesium hydroxide, potassium hydroxide, sodium hydroxide, and combinations thereof. Alternatively, the base may be an organic base such as phosphazene; tetraalkyl ammonium hydroxides including tetramethyl ammonium hydroxide, tetraethyl ammonium hydroxide, tetrabutyl ammonium hydroxide and tetrapropylammonium hydroxide; and combinations thereof The amount of base in the etching solution may be at least 0.01%, up to as high as the solubility limit of the base in the solvent, alternatively up to 10%.

Exposure to the etching solution may be, for example, by immersion. The exact time and temperature for immersion depends on various factors including whether step (v) is present and the heating conditions used in step (v) when present, whether all of the silicone will be removed or only a portion of the silicone will be removed, and the exact ingredients of the photopatternable silicone composition. However, immersion may be carried out at ambient temperature for 1 min to 60 min, alternatively 5 min to 30 min, alternatively 15 min to 25 min. Immersion times may be shorter at elevated temperatures. Alternatively, exposure to the etching solution may be by puddling the solution onto the silicone or continuous spraying such that the silicone is exposed to the etching solution for a time sufficient to remove all or a portion of the cured silicone layer. Exposure to the etching solution be at ambient or elevated temperatures. The temperature during exposure may be 15° C. to 80° C. It is expected that higher temperatures will provide higher etch rates.

Method of Use

The method of this invention is useful in rework applications. The method of this invention may also be useful in electronics applications where removal of the cured silicone layer is necessary or convenient for device builds, for example negative photoresist applications. The method of this invention may also be useful for cleaning silicones from surfaces.

EXAMPLES

These examples are intended to illustrate the invention to one skilled in the art and should not be interpreted as limiting the scope of the invention set forth in the claims.

Raw Materials

Resin is an organopolysiloxane resin consisting essentially of $CH_2=CH(CH_3)_2SiO_{1/2}$ units, $(CH_3)_3SiO_{1/2}$ units, and $SiO_{4/2}$ units, wherein the mole ratio of $CH_2=CH(CH_3)_2SiO_{1/2}$ units and $(CH_3)_3SiO_{1/2}$ units combined to $SiO_{4/2}$ units is about 0.7, and the resin has a weight-average molecular weight of about 22,000, a polydispersity of about 5, and contains about 5.5 mole percent (1.8% by weight) of vinyl groups.

Crosslinking Agent 1 is a mixture consisting of 88% of a trimethylsiloxy-terminated poly(dimethylsiloxane/methylhydrogensiloxane) having an average of 92 dimethylsiloxane units and 6 methylhydrogensiloxane units and per molecule and containing about 0.08% of silicon-bonded hydrogen atoms; 4% of dimethyl methylhydrogen cyclosiloxane; 4% of octamethylcyclotetrasiloxane; 3% of decamethylcyclopentasiloxane; and 1% of dimethylcyclosiloxanes ($D_6$ or greater).

Crosslinking Agent 2 is a mixture of 98% trimethylsiloxy-terminated poly(dimethylsiloxane/methylhydrogensiloxane), 1% trimethylsiloxy-terminated polydimethylsiloxane, and 1% octamethylcyclotetrasiloxane, said mixture having an SiH content of 0.71% to 0.85%.

Silicone Base is a mixture consisting of 61.32% of Resin; 22.09% of a mixture consisting of 88% of a trimethylsiloxy-terminated poly(dimethylsiloxane/methylhydrogensiloxane) having an average of 100 dimethylsiloxane units and 9 methylhydrogensiloxane units per molecule and containing about 0.11% of silicon-bonded hydrogen atoms, 5% of dimethyl methylhydrogen cyclosiloxane, 3% of octamethylcyclotetrasiloxane, 2% of decamethylpentasiloxane, 1% of methylhydrogen cyclosiloxanes, and 0.8% of dimethylcyclosiloxanes ($D_6$ or greater); 2.33% of a trimethylsiloxy-terminated poly(dimethylsiloxane/methylhydrogensiloxane) having an average of 3 dimethylsiloxane units and 5 methylhydrogensiloxane units per molecule and containing about 0.8% of silicon-bonded hydrogen atoms; and 14.27% of mesitylene. The Silicone Base was stored in a sealed amber bottle.

The platinum(II) acetylacetonate used to prepare Catalysts A-E was obtained from Strem Chemicals (Newburyport, Mass.). The material was purified by sublimation at a temperature of 140° C. and a pressure of 4 mmHg.

Catalyst D is a mixture consisting of 0.20% of platinum(II) acetylacetonate in mesitylene.

Mesitylene is A.C.S. reagent grade.

Etching Solution #1 is prepared by dissolving 6 parts of tetramethylammonium hydroxide pentahydrate in 94 parts isopropyl alcohol.

Etching solution #2 is prepared by dissolving 12 parts of tetramethylammonium hydroxide pentahydrate in 88 parts of isopropyl alcohol.

Etching solution #3 is prepared by dissolving 6 parts of a 50% solution of cesium hydroxide in water into 94 parts isopropyl alcohol.

Etching solution #4 is prepared by dissolving 6 parts of potassium hydroxide into 94 parts of isopropyl alcohol.

Etching solution #5 is prepared by dissolving 6 parts of tetramethylammonium hydroxide pentahydrate in 23.5 parts of water and 70.5 parts isopropyl alcohol.

Etching solution #6 is prepared by dissolving 6 parts of tetramethylammonium hydroxide pentahydrate in 94 parts of water.

Etching solution #7 is prepared by dissolving 6 parts of tetramethylammonium hydroxide pentahydrate in 94 parts 1-methoxy-2-propanol.

Reference Example 1

Preparation of Photopatternable Silicone Composition

Resin (62.9 parts), 19.1 parts of Crosslinking Agent 1, 3.0 parts Crosslinking Agent 2, and 14.1 parts of mesitylene are combined in an amber bottle. Catalyst D (0.9 part) is added to the blend and mixing is continued for 0.5 hour at room temperature. The mixture is then pressure-filtered (138 to 276 kPa nitrogen) through a stainless steel canister containing 10-micrometer (μm) and 5-μm nylon membranes in series. The silicone composition (filtrate) is stored prior to use at −15° C. in a closed polyethylene bottle wrapped in aluminum foil.

Example 1

Etching Times Using Etching Solution #1

The photopatternable silicone composition from reference example 1 is spin coated onto a 15.24 centimeter (cm) silicon wafer at 500 revolutions per minute (rpm) for 10 seconds (s) and 1500 rpm for 30 s. The wafer is heated on a hot plate at 110° C. for 2 minutes (min) to remove most of the solvent. The film is exposed to broadband radiation (300 to 400 nanometers, nm) through a photomask that contained 350-μm circular apertures for a total does of 1000 Joules per square centimeter ($J/cm^2$). The silicon wafer is heated on a hot plate at a temperature of 150° C. for 2 min. The silicon wafer is cooled. The wafer surface is flooded with a Stoddard solvent (NRD from Ashland Chemicals) for one minute. The wafer is rinsed with additional NRD while spinning at 500 rpm. The resulting wafer is coated with a 24-μm thick cured silicone layer, which is patterned in features.

This wafer is broken into 4 sections. Section 1 is evaluated without further processing. Section 2 is heated to 150° C. for 2 hours (h). Section 3 is heated to 180° C. for 1 h. Section 4 is heated to 250° C. for 30 min.

Each section is immersed in Etching Solution #1. The amount of time to remove the features is determined by visual inspection. The features are removed from section 1 in under 5 min. The features are removed from section 2 in 15 min. The features are removed from section 3 in 25 min. The features are removed from section 4 in 60 min.

Example 2

Examination of Dissolution Process

Sections are prepared as in example 1. Section 4, which is heated to 250° C. for 30 min, is immersed in Etching Solution #1 for a 30 minute partial dissolution. The height of the patterned features decreases from the original 24 μm to 8.3 μm. The smoothness of the partially etched feature indicates that the etch mechanism is one of dissolution rather than a simple lift-off of the cured silicone layer in this example.

Example 3

Etching Times Using Etching Solution #2

Sections are prepared as in example 1. Section 1, which has no post patterning heating step, is immersed in Etching Solution #2. The silicone layer dissolves in less than 5 minutes. Section 2, which is cured at 150° C. for 2 hours, is immersed in Etching Solution #2. The silicone layer dissolves in 8 minutes.

Example 4

Etching Times Using Etching Solution #3

Sections are prepared as in example 1. Section 1, which has no post patterning heating step, is immersed in Etching Solution #3. The silicone layer degrades to a whitish film after 5 minutes immersion. Etching Solution #3 becomes cloudy. Etching Solution #3 remains cloudy after 30 minutes, but the cloudiness can be removed by adding 10% water to Etching Solution #3.

Example 5

Etching Times Using Etching Solution #4

Sections are prepared as in example 1. Section 1, which has no post patterning heating step is immersed in Etching Solution #4. The silicone layer degrades to a whitish film within 5 minutes. Etching Solution #4 has a cloudy appearance after 30 minutes, and the cloudiness is not removed by adding 10% water to Etching Solution #4.

Example 6

Etching Times Using Etching Solution #5

Sections are prepared as in example 1. Section 1, which has no post patterning heating step is immersed in Etching Solution #5. The silicone layer degrades slowly with some film remaining after 40 minutes.

Comparative Example 7

Etching Times Using Etching Solution #6

Sections are prepared as in example 1. Section 1, which has no post patterning heating step is immersed in Etching Solution #6. The silicone layer does not to dissolve even after 3 days of immersion.

Example 8

Etching Times Using Etching Solution #7

Sections are prepared as in example 1. Section 1, which has no post patterning heating step is immersed in etching solution #7. The silicone layer dissolves in 12 minutes.

INDUSTRIAL APPLICABILITY

A silicone may be removed from a substrate by exposure of the silicone to an etching solution comprising an organic solvent and an organic or inorganic base. The dissolution of the silicone is rapid at room temperature, allowing for its use in a manufacturing environment. The etching solution is also simple and relatively mild (e.g., a mixture of isopropanol and tetramethyl ammonium hydroxide) such that the etching conditions are advantageous for an electronics environment.

The invention claimed is:

1. A method comprising:
   (i) applying a photopatternable silicone composition to a surface of a substrate to form a film, where the photopatternable silicone composition comprises
      (A) an organopolysiloxane containing an average of at least two silicon-bonded alkenyl groups per molecule,
      (B) an organosilicon compound containing an average of at least two silicon-bonded hydrogen atoms per molecule in a concentration sufficient to cure the composition, and
      (C) a catalytic amount of a photoactivated hydrosilylation catalyst;
   (ii) exposing a portion of the film to radiation to produce a partially exposed film having non-exposed regions covering at least a portion of the surface and exposed regions covering the remainder of the surface;
   (iii) heating the partially exposed film for an amount of time such that the exposed regions are substantially insoluble in a developing solvent and the non-exposed regions are soluble in the developing solvent;
   (iv) removing the non-exposed regions of the heated film with the developing solvent to form a patterned film;
   (v) heating the patterned film; and
   (vi) removing all or a portion of the product of step (v) using an etching solution where step (vi) is performed by immersion of the product of step (v) in the etching solution at ambient temperature for 1 to 25 minutes.

2. A method comprising:
   (i) applying a photopatternable silicone composition to a surface of a substrate to form a film, where the photopatternable silicone composition comprises
      (A) an organopolysiloxane containing an average of at least two silicon-bonded alkenyl groups per molecule,
      (B) an organosilicon compound containing an average of at least two silicon-bonded hydrogen atoms per molecule in a concentration sufficient to cure the composition, and
      (C) a catalytic amount of a photoactivated hydrosilylation catalyst;
   (ii) exposing a portion of the film to radiation to produce a partially exposed film having non-exposed regions covering at least a portion of the surface and exposed regions covering the remainder of the surface;
   (iii) heating the partially exposed film for an amount of time such that the exposed regions are substantially insoluble in a developing solvent and the non-exposed regions are soluble in the developing solvent;
   (iv) removing the non-exposed regions of the heated film with the developing solvent to form a patterned film;
   (v) removing all or a portion of the patterned film using an etching solution where step (v) is performed by immersion of the product of step (iv) in the etching solution at ambient temperature for 1 to 25 minutes.

3. The method of claim 1, where the substrate is an active surface of a semiconductor wafer.

4. The method of claim 1, where the removing step is carried out using an etching solution comprising an organic solvent and a base.

5. The method of claim 4, where the etching solution contains no more than 25% water based on the weight of the etching solution.

6. The method of claim 4, where the organic solvent is selected from a monohydric alcohol, a dihydric alcohol, a monoether, a diether, a polar aprotic solvent, and combinations thereof.

7. The method of claim 4, where the base is selected from ammonium hydroxide, cesium hydroxide, potassium hydroxide, sodium hydroxide, and combinations thereof.

8. The method of claim 4, where the base is selected from phosphazene, tetraalkyl ammonium hydroxides, and combinations thereof.

9. The method of claim 4, where the solvent is a monohydric alcohol selected from the group consisting of methanol, ethanol, n-propanol, isopropanol, n-butanol, isobutanol, tert-butanol, and combinations thereof.

10. Use of the method of claim 1 for rework, photoresist, or cleaning applications.

11. The method of claim 2, where the substrate is an active surface of a semiconductor wafer.

12. The method of claim 2, where the removing step is carried out using an etching solution comprising an organic solvent and a base.

13. The method of claim 2, where the etching solution contains no more than 25% water based on the weight of the etching solution.

14. The method of claim 12, where the organic solvent is selected from a monohydric alcohol, a dihydric alcohol, a monoether, a diether, a polar aprotic solvent, and combinations thereof.

15. The method of claim 12, where the base is selected from ammonium hydroxide, cesium hydroxide, potassium hydroxide, sodium hydroxide, and combinations thereof.

16. The method of claim 12, where the base is selected from phosphazene, tetraalkyl ammonium hydroxides, and combinations thereof.

17. The method of claim 12, where the solvent is a monohydric alcohol selected from the group consisting of methanol, ethanol, n-propanol, isopropanol, n-butanol, isobutanol, tert-butanol, and combinations thereof.

18. Use of the method of claim 2 for rework, photoresist, or cleaning applications.

19. The method of claim 1, where the etching solution comprises an organic solvent and a base, and the etching solution contains no more than 6% water based on the weight of the etching solution.

20. The method of claim 19, where the etching solution contains no more than 3% water based on the weight of the etching solution.

21. the method of claim 19, where the etching solution is anhydrous.

22. The method of claim 2, where the etching solution comprises an organic solvent and a base, and the etching solution contains no more than 6% water based on the weight of the etching solution.

23. The method of claim 22, where the etching solution contains no more than 3% water based on the weight of the etching solution.

24. the method of claim 2, where the etching solution is anhydrous.

* * * * *